United States Patent
Juengling

[19]

[11] Patent Number: 5,981,384

[45] Date of Patent: Nov. 9, 1999

[54] METHOD OF INTERMETAL DIELECTRIC PLANARIZATION BY METAL FEATURES LAYOUT MODIFICATION

[75] Inventor: Werner Juengling, Boise, Id.

[73] Assignee: Micron Technology, Inc., Boise, Id.

[21] Appl. No.: 08/514,988

[22] Filed: Aug. 14, 1995

[51] Int. Cl.⁶ .................................................. H01L 21/44
[52] U.S. Cl. .................... 438/666; 438/668; 438/669; 438/673; 438/637; 438/926
[58] Field of Search ...................... 437/231, 228, 437/195; 438/666, 668, 669, 673, 637, 926

[56] References Cited

U.S. PATENT DOCUMENTS

| | | | |
|---|---|---|---|
| 4,584,079 | 4/1986 | Lee et al. | 204/192 |
| 4,818,723 | 4/1989 | Yen | 437/200 |
| 4,916,514 | 4/1990 | Nowak | 357/68 |
| 5,266,525 | 11/1993 | Morozomi | 437/195 |
| 5,378,646 | 1/1995 | Huang et al. | 437/47 |
| 5,453,406 | 9/1995 | Chen | 437/231 |
| 5,461,010 | 10/1995 | Chen et al. | 437/228 |
| 5,494,853 | 2/1996 | Lur | 437/195 |
| 5,530,290 | 6/1996 | Aitka et al. | 257/758 |
| 5,604,381 | 2/1997 | Shen | 257/773 |
| 5,631,478 | 5/1997 | Okumura | 257/211 |
| 5,639,688 | 6/1997 | Delgado et al. | 437/191 |
| 5,639,697 | 6/1997 | Weling et al. | 438/926 |
| 5,668,401 | 9/1997 | Chao et al. | 257/620 |
| 5,702,985 | 12/1997 | Burns | 437/217 |

*Primary Examiner*—John F. Niebling
*Assistant Examiner*—Lynne A. Gurley
*Attorney, Agent, or Firm*—Workman, Nydegger & Seeley

[57] ABSTRACT

A technique is disclosed for general IC structures to modify the layout of electrically unisolated metal lines before patterning same so that the spacing between the metal lines is substantially standardized prior to performing deposition of an intermetal dielectric layer. Upon such standardization of metal line spacing, the intermetal dielectric will be planarized in a single process step of deposition. Circuit layout design modifications can be made by adding electrically isolated dummy metal line features in areas of the layout having open spaces between parallel metal lines, and adding metal line spacers to existing metal lines to reduce the spacing between the metal lines and dummy metal features. As the nonstandard spacing between metal lines becomes standardized, an intermetal dielectric deposition results in a planarized surface of the intermetal dielectric. Consequently, many conventional process steps for planarizing the intermetal dielectric can be skipped or simplified.

20 Claims, 6 Drawing Sheets

METHOD OF INTERMETAL DIELECTRIC PLANARIZATION BY METAL FEATURES LAYOUT MODIFICATION

BACKGROUND OF THE INVENTION

1. The Field of the Invention

This invention relates to design layout for metal lines of an integrated circuit, an ASIC/SRAM or DRAM structure, and more particularly relates to deposition of an intermetal dielectric oxide layer over metal lines so as to leave a fully planarized surface of the intermetal dielectric layer through standardization of spacing between metal features situated on a substrate.

2. The Relevant Technology

Conventionally designed metal line layouts of integrated circuits (IC) structures necessitate that, after metal etching, large spaces will be left between nearest parallel electrically isolated metal lines. These spacings are random in size and have a great variety of dimensions. When an intermetal dielectric layer, such as an oxide, is deposited over the metal lines having random spacing therebetween, the top surface of the intermetal dielectric is (IDL) will have an altitude of the thickness of the metal features ($T_{met}$) plus the thickness of the intermetal dielectric layer ($T_{idl}$). In those areas where there are no metal features but only open space, the altitude of the top surface of the intermetal dielectric layer will be $T_{idl}$.

Figure 1:
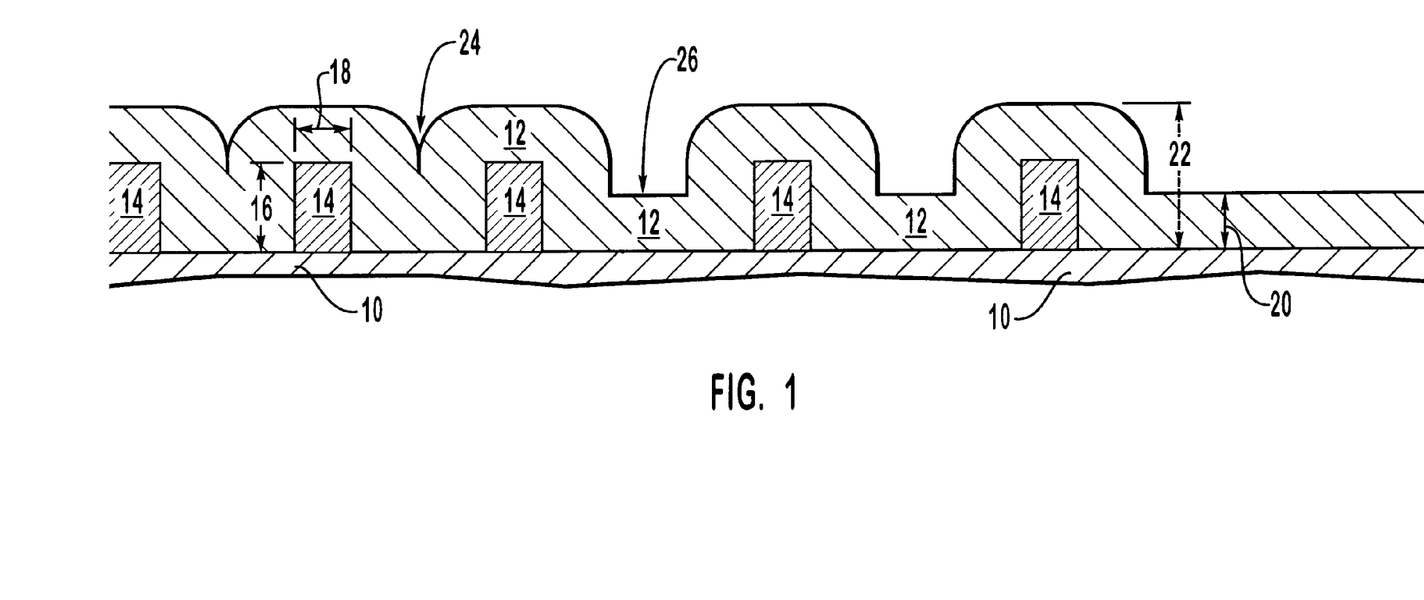
FIG. 1 is a cross-sectional elevation view of an integrated circuit (IC) with a substrate having a plurality of metal lines thereon, the spacing between the metal lines varying, and there being an intermetal dielectric layer deposited over the metal lines so as to have a variety of altitudes to the top surface thereof.

FIG. 1 depicts a conventional integrated circuit structure having a metal line layout thereon. In FIG. 1, a substrate 10 has an intermetal dielectric layer 12 situated thereon. Intermetal dielectric layer 12 is also situated upon a series of metal lines 14. Metal lines 14 are placed upon substrate 10 by a process known as metal patterning. After contact formation, a thin layer of conducting metal is deposited by conventional techniques over the substrate. Unwanted portions of the metal film are removed by photomasking and etch procedure or by lift-off. A heat treatment step may be performed to flow material into contacts, or to alloy the remaining metal film, which are called metal lines, so as to ensure good electrical contact between the metal film and the underlying contact areas.

After the forgoing metal patterning process, or variations thereof, each metal line 14 has a thickness $T_{met}$ 16 and has a width≧$W_{met}$ 18. The thickness of intermetal dielectric layer 12 is $T_{idl}$ 20. The altitude of the top surface of the intermetal dielectric layer 12 is seen as $T_{met}+T_{idl}$, seen at 22.

FIG. 1 shows intermetal dielectric layer 12 as being nonplanarized and having both large and small trenches in IDL 12. Where spacing between two metal features is small, a narrow or fused trench 24 results. Trench 24 has a narrow width and a high height thereto. If the trench is filled with IDL the final structure has a height of $T_{met}+T_{idl}$. Where the spacing between metal features is wide, a nonplanar structure with heights of $T_{idl}$ and $T_{idl}+T_{met}$ results, as in 26. FIG. 1 also shows that the surface of IDL 12 is constant in large areas where no metal features exist, such as the right-hand side of FIG. 1 showing the top surface of IDL 12 to have an altitude of $T_{idl}$, as seen at 20.

After a conventional metal line layout, altitude differences exist in the top surface of the intermetal dielectric layer deposited thereover. The processing that tries to minimize or eliminate the different altitudes of the top surface of the IDL in the different areas of the metal line design layout is called planarization. Conventional planarization requires a complicated series of process steps, which increases cost, and reduces yield in manufacturing.

Figure 2:
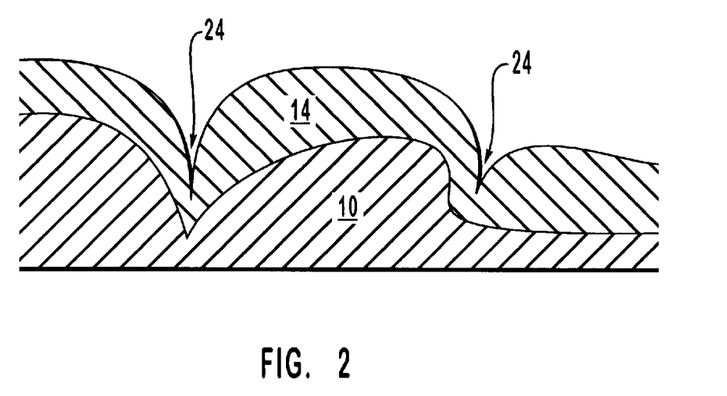
FIG. 2 is a cross-sectional elevational view of a substrate showing trench area of typically poor step coverage due to a non-planar layer under a metal layer.

When the altitude of the top surface of an IDL or metal film varies, it is more difficult to print small features using photolithography because the photolithography equipment has a limited depth of focus. Areas of different altitude of the top surface of the IDL will print differently in size and resolution of features during the photolithography. Metal stringers can remain after dry chemistry metal etching along the slopes of the nonplanar surface so as to cause an electrical short between adjacent metal lines. Additionally, transitions between areas of different altitude of the layer below a metal film 14 will result in poor step coverage at trenches 24 of the metal layer 14 in these areas, as seen in FIG. 2.

Figure 3:
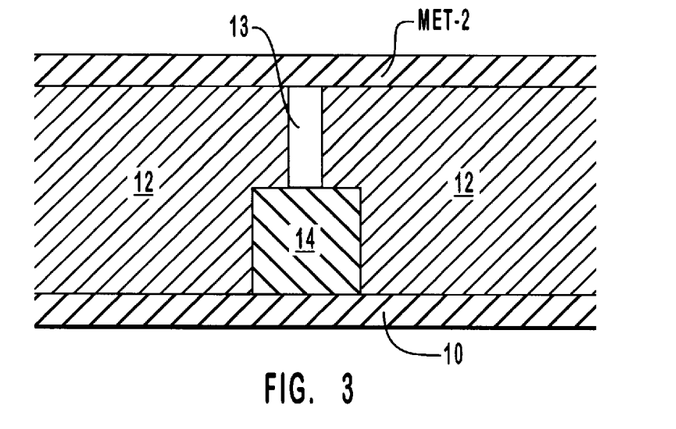
FIG. 3 is a cross-sectional elevational view of a substrate showing metal filling problem for a via having high aspect ratios.
Figure 4:
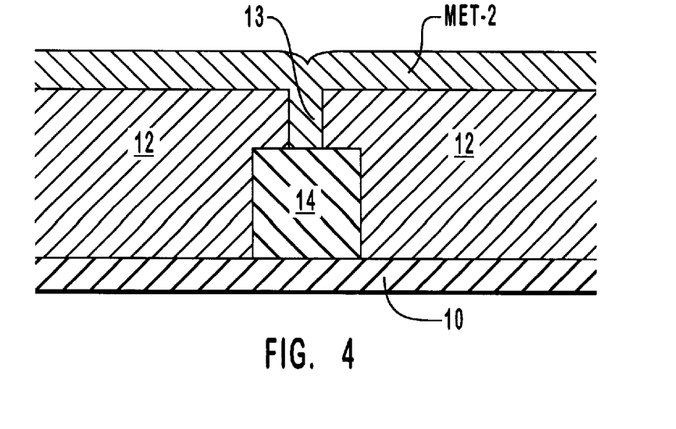
FIG. 4 is a cross-sectional elevational view of a substrate showing improved metal filing for low aspect ratio vias.

Conventional planarization often requires a relatively thick IDL layer 12 to guarantee an uninterrupted IDL film over a metal pattern 14 for electrical isolation. This thick IDL layer 12 can complicate the formation of the next vias due to high aspect ratios, as is seen at 13 in FIG. 3 for a second metal layer MET-2. Conversely, a low aspect ratio at 13, as seen in FIG. 4, is easier for metal layer MET-2 to fill.

A random distribution of metal pattern may lead to an unbalanced distribution of areas with metal features and without metal features which can cause nonuniformities in the etching process.

Accordingly, it would be an advance in the art to planarize the IDL with as few process steps as possible, so as to be beneficial in the photolithography metal deposition and etching process steps that follow the deposition of the IDL.

SUMMARY AND OBJECTS OF THE INVENTION

It is an object of the present invention to standardize linear and diagonal spacing between nearest parallel and diagonal metal features for integrated circuit metal line layout designs, so that the deposition of an IDL will be substantially planarized due to such standardization of spacing.

It is also an object of the invention to simplify or eliminate a number of processing steps for IC structures and thereby increase throughput and increase yield.

A further object of the present invention is to reduce the minimum thickness of the intermetal dielectric layer to be deposited as well as its uniformity in order to minimize metal step coverage problems at vias during the next metal layer deposition.

The inventive process enhances metal line layout designs by decreasing the spacing between various metal features so as to standardize the spacing. This standardization is accomplished by adding electrically isolated dummy metal features, and/or increasing the size of existing electrically unisolated metal lines to reduce the spacing between nearest parallel metal lines to the standardized spacing. Preferably, the standardized spacing between nearest metal lines that parallel one another should be less than or equal to twice the thickness of the intermetal dielectric layer to be deposited thereover.

Where nearest points on metal features are separated diagonally, it is preferable that the separation therebetween be less than or equal to the thickness of the intermetal dielectric layer times 2.

Once the invention IC structure has a design thereto which minimizes the spacing between nearest parallel metal lines according to the inventive process, a deposition of an intermetal dielectric layer is made, the result of which will be its substantial planarization due to the uniform spacing between electrically isolated dummy metal features and metal lines beneath the intermetal dielectric layer.

Since there are no further processing steps for the planarization of the IDL, the IDL can be kept thin, it will have a good uniformity, and the aspect ratio for subsequent vias to be patterned will result in a favorable aspect ratio and good step coverage in the vias during the next metal layer to be deposited thereover. This process can be repeated for an unlimited number of metal line layers.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 5:
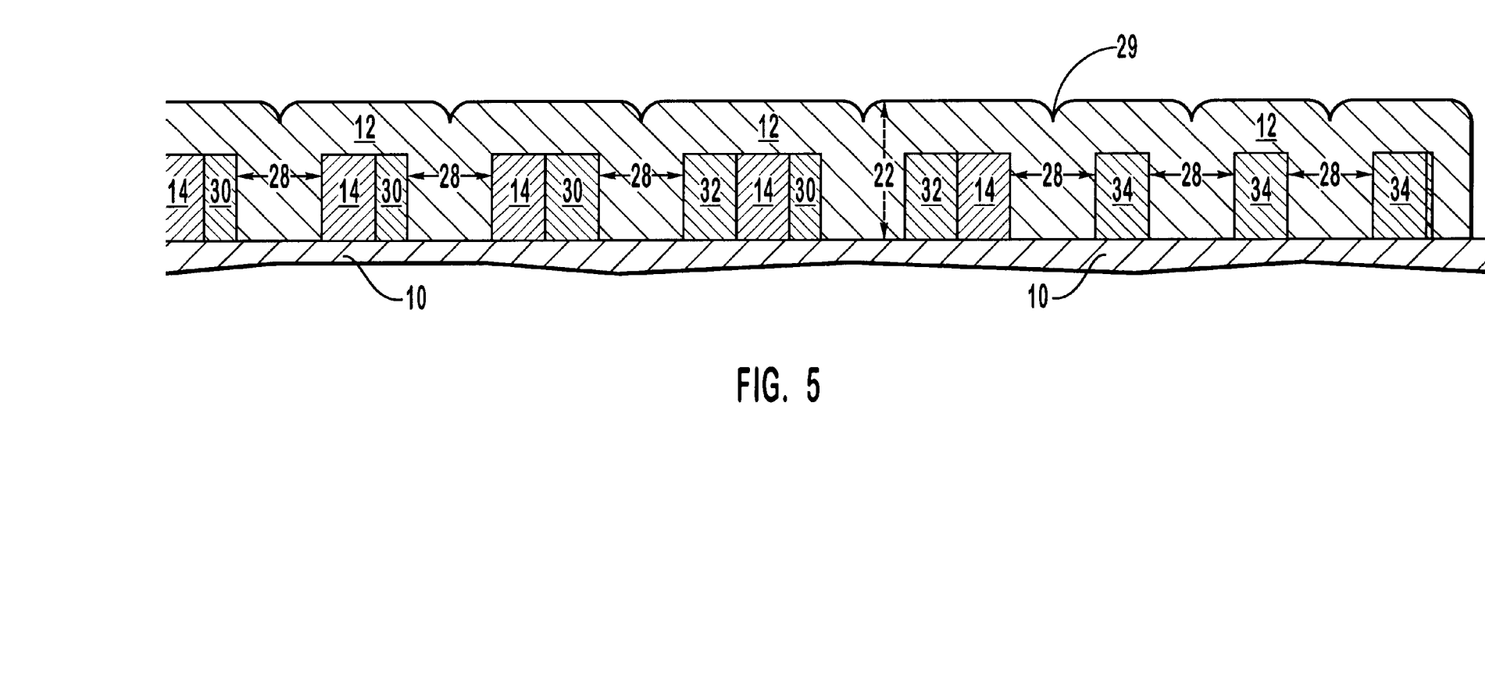
FIG. 5 is a cross-sectional elevational view of the structure seen in FIG. 1, with enhanced metal line features so as to standardize the spacing therebetween, and resulting in a planarized intermetal dielectric layer having minimized trenches at the top surface thereof between metal line features.

FIG. 5 depicts the metal line layout of FIG. 1 with enhanced metal features so as to standardize the spacing therebetween. As seen in FIG. 5, a substrate 10 has thereon intermetal dielectric layer (IDL) 12. Each metal line 14 seen in FIG. 5 changed width as compared to FIG. 1 resulting in additional features 30, 32. Each metal line 14 has a width of $W_{met}$ or wider. Metal line features 30, 32 increase the resultant width of the metal line so as to result in a standardized distance $S_{met}$ between nearest parallel metal features seen in FIG. 5. By standardizing $S_{met}$ 28, IDL 12 is planarized at an altitude 22 of: [$T_{met}$ 16 plus $T_{idl}$ 20]. Fused trenches between enhanced metal features result, as seen at 29 in FIG. 5. Consequently, the top surface of IDL 12 is substantially planarized after a single deposition process step.

FIG. 5 also shows the addition of electrically isolated dummy metal features 34, where large areas of spacing exist on substrate 10 for which there are no metal lines 14. Again, each dummy metal feature 34 is as small as possible and has a spacing of $S_{met}$ 28 to other metal features.

Figure 6:
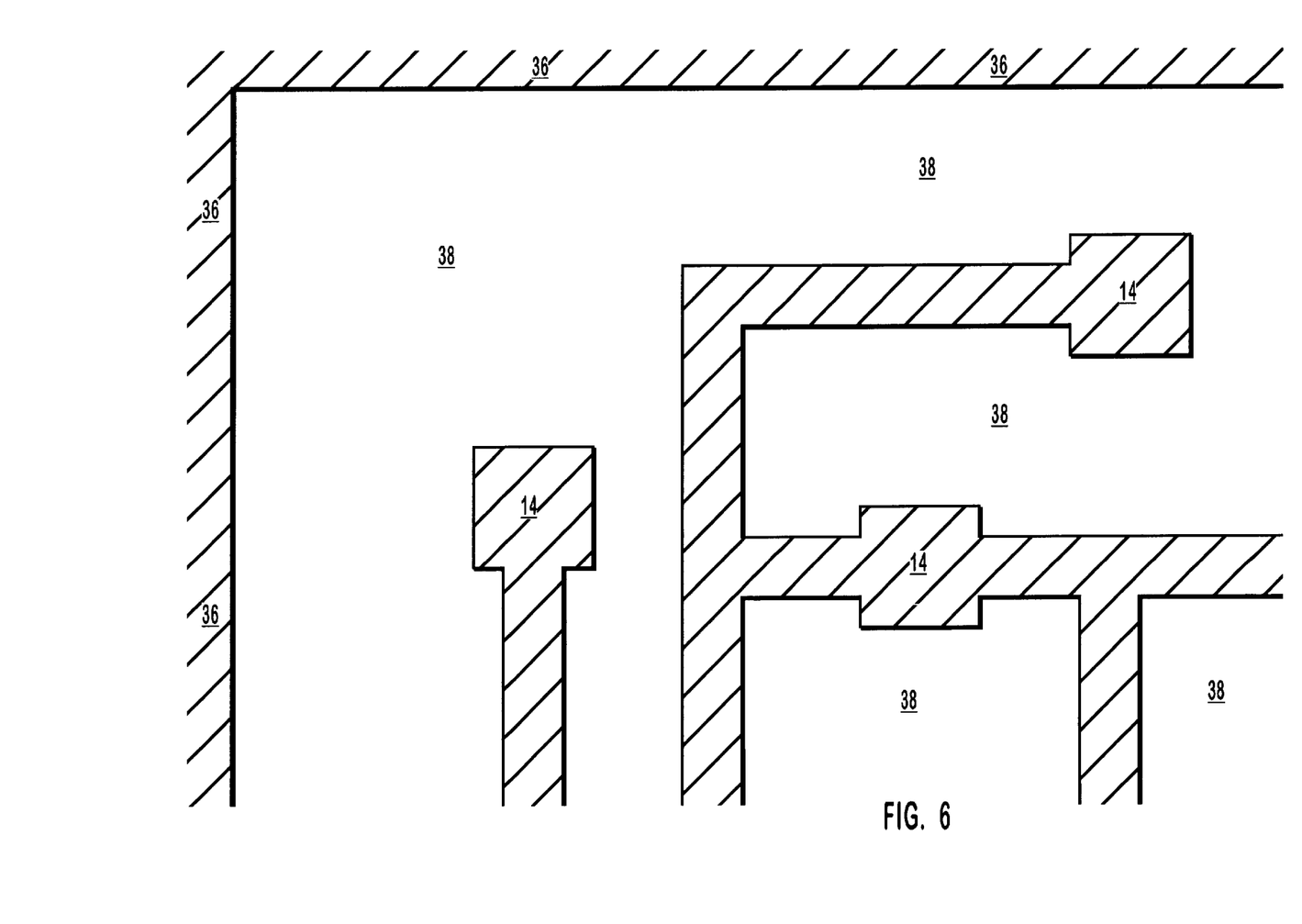
FIG. 6 shows a top view of an IC with a metal line layout design circumscribed within a guard ring at the periphery thereof, and having no standardized spacing between nearest parallel metal lines.
Figure 7:
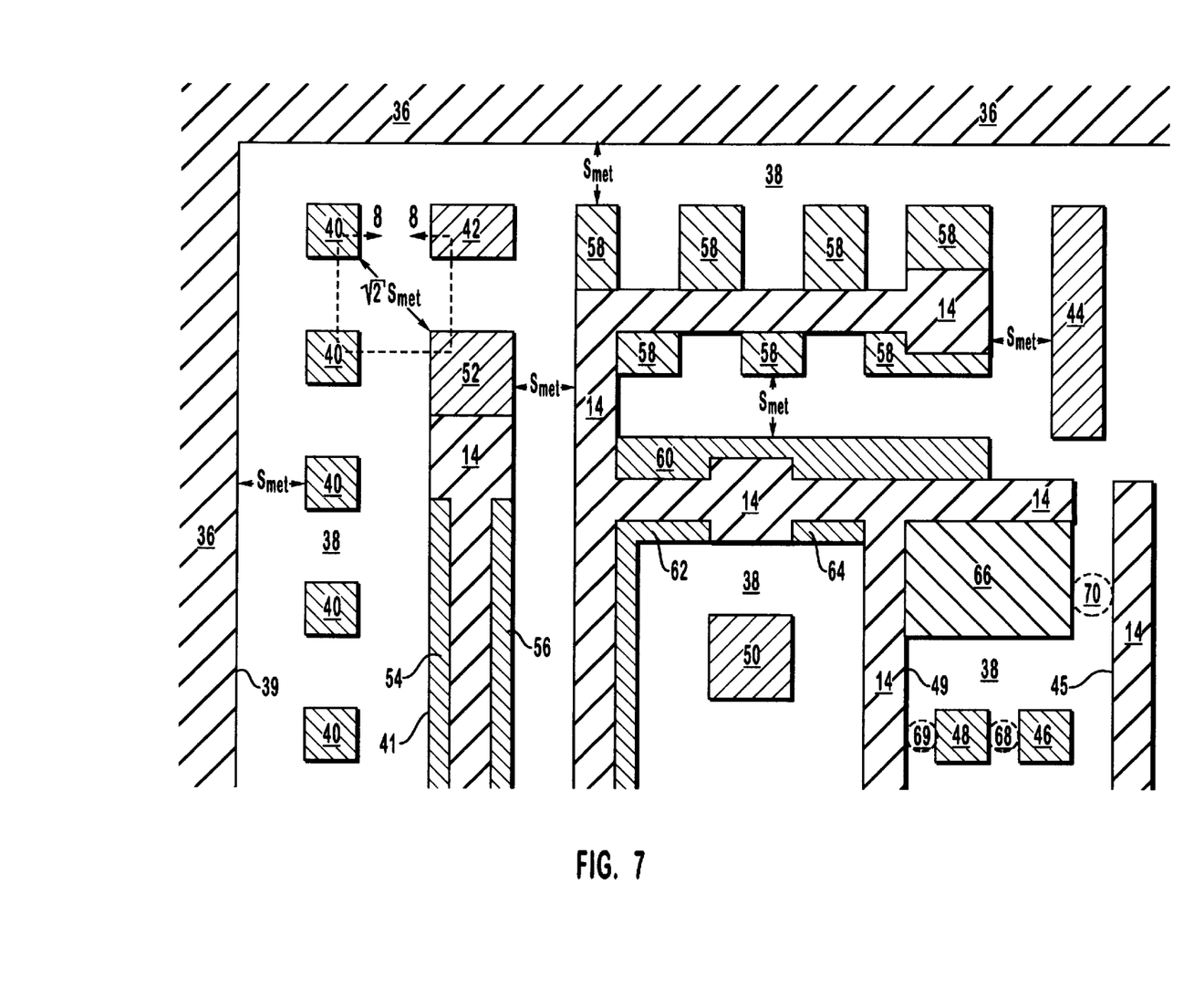
FIG. 7 is a top view of the IC seen in FIG. 6 with a layout having enhanced metal line dimensions and dummy metal features added so as to standardize the spacing between both the metal features and the guard ring.

FIGS. 6 and 7 demonstrate an alternative preferred embodiment of the invention in which a conventional metal line layout seen in FIG. 6 can be enhanced to the metal line design layout seen in FIG. 7 so as to standardize the distance between linear and diagonally nearest metal features. In FIG. 6, a guard ring 36 surrounds metal lines 14 having open space 38 therebetween. The spacing between metal lines 14 is random and varies extensively. Guard ring 36 is the outermost limit of the IC structure, and serves to avoid diffusion of undesirable materials such as sodium that would change the threshold voltages of the structure. Thus, guard ring 36 serves as a diffusion barrier. After the inventive process steps, the top surface of an IDL within guard ring 36 will be fully planarized.

In FIG. 7, a number of electrically isolated dummy metal lines 40, 42, 44, 46, 48, and 50 have been added within open space 38 between electrically unisolated metal lines 14 and guard ring 36. Additionally, metal line features 52, 54, 56, 58, 60, 62, 64, and 66 have been added to existing metal lines 14. Dummy metal lines 40–50 and metal line features 52–66 have been added so as to standardize the distance between diagonally oriented nearest metal features, and to standardize the distance between nearest parallel metal line features. Additionally, the distance between guard ring 36 and nearest metal features has also been standardized.

As seen in FIG. 7, the standardized spacing between nearest parallermetal features and guard ring 36 is $S_{met}$. Also shown in FIG. 7 is the standardized distance between nearest diagonally spaced points of metal features which is represented as $\sqrt{2}\, S_{met}$ seen between metal line spacer 52 and dummy metal line 40 in the upper left hand corner of FIG. 7.

Preferably, the selection of the standardized spacing between design feature $S_{met}$ will be a function of thickness $T_{idl}$ of IDL 12 only.

When redesigning a conventional IC structure so as to standardize spacing between metal features $S_{met}$, n is calculated according to the following Equation A:

$$S_{min} < S_{met} \leq [1.4(n+1)T_{idl}] + (n)W_{met}];$$

where n is a maximized whole number and $W_{met}$ is the smallest standardized width of the metal line, and when $S_{min}$ is the limit dimension by photolithography as a design rule. The foregoing Equation A is calculated for a maximized n for each area of the IC structure having an open space between nearest parallel metal features. The resultant calculated metal spacing $S_{met}$ is constrained by the requirement that it must be less than or equal to twice the IDL thickness $T_{idl}$ for nearest metal features parallel to one another. Additionally, when calculating $S_{met}$ for nearest diagonally spaced metal feature points, $S_{met}$ is constrained to be less than or equal to $\sqrt{2}\ T_{idl}$, or about 1.4 $T_{idl}$. Furthermore $S_{met}$ must be larger than the design rule $S_{min}$.

Once the maximized value of n is known, dummy metal lines are added to the open space according to the value of n. By way of example, points 45 and 49, seen in the lower right hand corner, show the addition of two dummy metal lines 48, 46. Thus, the maximized value of n for open space 38 between points 45, 49 is 2. Points 39, 41, seen in the lower left hand corner of FIG. 7, show only one dummy metal line 40 therebetween, which indicates that the maximized value of n is 1 given open space 38 between points 39, 41.

The foregoing Equation A presumes that all dummy metal lines that are added to the design layout in the open spaces according to maximized integer n, shall have a substantially constant width of $W_{met}$ which is the same as the smallest possible metal line as defined by design rules and the photolithography process.

Where the foregoing equation results in a maximized value of n that is less than 1, or the remaining open space between is greater than the standardized spacing of $S_{met}$, then existing metal lines can have metal line features added thereto so as to reduce the spacing between metal features or the guard ring to a standardized spacing. By way of example, FIG. 7 shows metal line spacers 58 having a distance of $S_{met}$ to guard ring 36. In this case, metal line 14 was enhanced by metal line features 58 so as to standardize the distance to guard ring 36 to be $S_{met}$.

Metal line features 58 are to be contrasted with metal line features 54, 56 in that metal line spacers 54, 56 are continuous in length, whereas metal line spacers 58 are staggered rather than continuous. By staggering metal line spacers 58, there is a reduction in capacitive coupling between two adjacent but isolated metal lines as compared to metal lines 54 and 56 against metal lines 14. Such staggering of metal line spacers 58 can be accomplished while still maintaining a standardized separation between metal features of $S_{met}$. Similarly, dummy metal lines 40, by staggering the same, cause less capacitive coupling between metal lines as compared to dummy metal line 44. Furthermore, dummy metal lines 40 are less likely to cause a yield loss due to electrically conductive particles as compared to the dummy metal line 44.

As mentioned, it is preferable that both the dummy metal lines and the metal line features be kept as small as possible. The reason for this is to minimize the metal line coupling capacitance inherent in larger metal lines. By way of example, metal line spacer 66 is quite large and tends to increase coupling capacitance. An inherent problem in increasing coupling capacitance is that it tends to slow down the circuit and to consume more power.

According to the proposed implementation of Equation A, it is advantageous that, rather than increasing the size of a metal line spacer, it is better to maximize the number of dummy metal lines 'n' so as to fill up open space between nearest parallel metal features. As a negative example of this benefit, metal line feature 66 is increased in size at the right side from metal line 14 so as to allow only one space between itself and the adjacent metal line 14. When only one space exists between electrically conductive metal features, the chances for an electrically conductive particle impurity being entrapped therein or any other particle "masking" the gap during metal etching and causing a short between the metal features represents a high probability. By way of example, metal line spacer 66 is in contact with an electrically conductive particle 70 having a width of $S_{met}$ or greater, where particle 70 is also in contact with metal line 14 above point 45 thereon. Particle 70 will serve to short out metal line spacer 66 and metal line 14.

Conversely, by increasing the number of electrically isolated dummy metal lines placed within an open area between nearest parallel electrically conductive metal lines, there is a lesser probability of entrapping conductive or "masking" particles so as to short out the electrically conductive metal lines. By way of example, dummy metals lines 46, 48 between points 45, 49 have particles 68 and/or 69 entrapped therebetween. Because dummy metal lines 46, 48 are electrically isolated, particles 68 and/or 69 will not cause a shorting out of metal lines 14 at points 45 and 49. Thus, open area 38 between dummy metal lines 46, 48 serves as a means to entrap electrically conductive or "masking" particles 68 and/or 69. Any such electrically isolated dummy metal line will help to entrap electrically conductive or "masking" particles, rather than allowing them to reduce the yield by shorting out nearest parallel electrically conductive metal lines.

In FIG. 7, open space 38 has been standardized to be at a distance of $S_{met}$ between all metal features, with the exception of a distance of $\sqrt{2}\ S_{met}$, or about 1.4 $S_{met}$ between nearest diagonally spaced points on metal features. By so standardizing the distance between metal features, a single deposition of an intermetal dielectric layer will result in a planarized top surface of the intermetal dielectric layer, as well as a minimized thickness of the intermetal dielectric layer.

Figure 8:
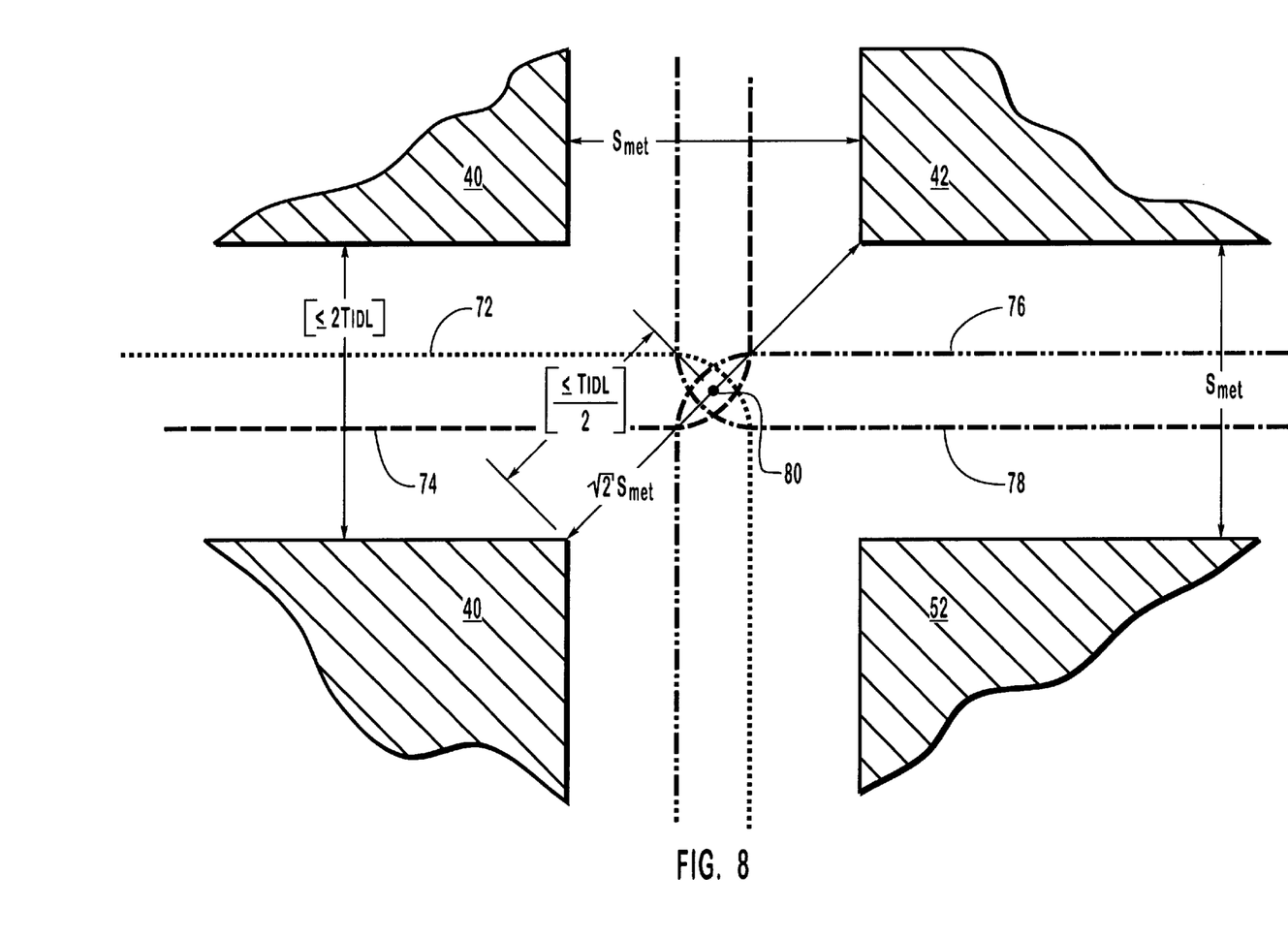
FIG. 8 is a top view taken along the 8—8 line seen in FIG. 7 and illustrates preferred spacing between diagonally spaced nearest metal feature points, as well as preferred spacing between nearest parallel metal features.

FIG. 8 depicts electrically isolated dummy metal lines 40, 42, and metal line feature 52. Each of these metal features has a point thereon which is diagonally spaced from another nearest point of a different metal feature. The diagonal distance between points on dummy metal lines 40, 42 is seen by $\sqrt{2}\ S_{met}$. Also shown in FIG. 8 is overlapping layers 72, 74, 76, and 78 of the intermetal dielectric that cover the respective dummy metal lines 40, 42, and 52. Specifically, IDL 72 overlaps dummy metal line 40 in the lower left hand corner of FIG. 8.

IDL 74 overlaps dummy metal line 40 in the upper left hand corner of FIG. 8. IDL 76 overlaps metal line feature 52 in the lower right hand corner of FIG. 8. IDL 78 overlaps dummy metal line 42 in the upper right hand corner of FIG. 8. There is a convergence of IDLs 72, 74, 76, 78 at a midpoint between the four diagonally oriented points on metal features 40, 42, 52. This middle point of convergence is designated at 80 in FIG. 8. Preferably, the distance between middle point 80 and the respective four diagonal points seen on metal features 40, 42, 52 will be less than or equal to $T_{idl} \div 2$. By so dimensioning the spacing between nearest diagonally adjacent metal feature points, there is an assurance that the IDL will cover the center point so as to be substantially planarized at the top surface thereof at a like altitude to the IDI, over metal features in the layout.

The distance between nearest parallel metal features seen in FIG. 8 is $S_{met}$, and the distance between nearest diagonally adjacent points on metal features, being a hypotenuse of a right triangle, is $\sqrt{2}\ S_{met}$ or about 1.4 $S_{met}$. Preferably, the length between the nearest diagonal features will be less than $\sqrt{2} \cdot T_{idl}$, or about 1.4 $T_{idl}$. Preferably, also, the distance between nearest parallel metal features will be less than or equal to 2 $T_{idl}$. By implementing this spacing algorithm, the altitude of the top surface of the IDL will be the same over open spacing areas as well as over metal features.

By implementing the proposed algorithms herein, a substantially planarized IDL with fused trenches between metal features will result after a single thin deposition of the IDL. As mentioned, these algorithms are a function of the thickness of the IDL as well as the substantially constant smallest width of the electrically unisolated standard metal lines.

By standardizing the spacing between nearest metal features, improved processing throughout the IC structure will result due to the uniformity of spacing. A lesser amount of metal has to be etched which reduces etch times and increases throughput. The more uniform distribution of the metal and non-metal areas will also avoid local perturbations of the plasma during dry etching.

Deposition techniques known in the art can be used to fill narrow gaps proposed by the inventive algorithms of standardizing spacing between metal features, which gap-filling techniques were unknown in the early years of semiconductor technology.

With respect to deposition of an IDL, the present inventive algorithm enables a thinner layer of intermetal dielectric in that the spacing between metal features is smaller due to its standardization. Thus, where conventional techniques like photoresist etchback or CMP require an IDL having a thickness of 12,000 Angstroms, the present inventive Algorithm enables a deposition of an IDL having a thickness of 7,000 Angstroms. The thinner IDL will require less deposition time and material usage. Thus, a smaller throughput time results.

As a further preferred embodiment of the present invention, the design layout may be enhanced by adding a plurality of dummy via features. The open areas of the IC design layout are searched and minimum sized dummy vias are added to thereto which are not connected to any feature, and are thus electrically isolated. By having dummy vias in the design layout, the end point detection during via etching will be more positively known due to an increased signal strength indicating the end point of the etching. Such an endpoint etching signal is known in the art.

The objects and goals of this invention must be tempered and conditioned in several ways. First, it is desirable that any dummy metal lines added not be electrically charged, but must rather be uncharged. Additionally, it is a goal of the invention to increase the size of existing metal line as little as possible to avoid a stronger coupling capacitance between adjacent metal layers which tend to slow down circuits, and cause additional power usage.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of fabricating an IC structure comprising:
    patterning a plurality of electrically unisolated metal lines on a substrate, said plurality of metal lines including at least three substantially parallel metal lines, each said electrically unisolated metal line:
        having a substantially equal height $T_{MET}$ and being parallel one with another; and
        being separated from the nearest of the other electrically unisolated metal lines;
    patterning n electrically isolated metal lines each:
        having a width $W_{met}$; and
        being situated in the separation between the electrically unisolated metal line and the nearest of the other electrically unisolated metal lines;
    wherein there is a separation $S_{met}$ between:
        each electrically unisolated metal line and the nearest of one of:
            another electrically unisolated metal line; or
            one of said electrically isolated metal lines;
        each electrically isolated metal line and the nearest of one of:
            another electrically isolated metal line; or
            one of said electrically unisolated metal lines;
    depositing a dielectric layer having a thickness of $T_{idl}$ over:
        said plurality of electrically unisolated metal lines; and
        said n electrically isolated metal lines,
    wherein:
        $S_{met}$ is not greater than $(1.4(n+1)T_{idl})+(n)W_{met})$ or twice $T_{idl}$;
        n is a maximized whole number not greater than $(S_{met}-1.4T_{idl})/(1.4T_{idl}+W_{met})$;
        one of said plurality of electrically isolated or unisolated metal lines is diagonally spaced from the nearest portion of another one of said plurality of electrically isolated or unisolated metal lines by a distance that is equal to $\sqrt{2}*S_{met}$; and
        said thickness of $T_{idl}$ has a value of at least $(\sqrt{2}*S_{met})\div 2$.

2. The method for fabricating the IC structure as defined in claim 1, wherein the maximum spacing between nearest diagonally spaced points on said electrically isolated or electrically unisolated metal lines is less than or equal to about twice the thickness of the dielectric layer.

3. The method for fabricating the IC structure as defined in claim 1, wherein the minimum width of said electrically isolated or electrically unisolated metal lines and the minimum spacing between the closest parallel electrically isolated or electrically unisolated metal lines are about equal.

4. The method for fabricating the IC structure as defined in claim 1, wherein said dielectric layer is planarized upon said depositing.

5. The method for fabricating the IC structure as defined in claim 1, wherein at least one electrically isolated metal line is situated between two nearest electrically unisolated metal lines.

6. The method for fabricating the IC structure as defined in claim 1, wherein each of the electrically unisolated metal lines has a length and a width, and wherein the width of the electrically unisolated metal lines varies.

7. The method for fabricating the IC structure as defined in claim 1, further comprising a guard ring circumscribing said electrically isolated or electrically unisolated metal lines, said guard ring having said separation $S_{met}$ to the nearest electrically isolated or electrically unisolated metal line parallel thereto.

8. The method of fabricating the IC structure as defined in claim 1, further comprising:
    applying a layer of photoresist over said dielectric layer;
    exposing said layer of photoresist in an area positioned over at least one metal line of said electrically unisolated metal lines;
    developing said layer of photoresist to open at least one via positioned over said at least one metal line of said electrically unisolated metal lines; and
    depositing a second metal line into said at least one via so as to make underlying contact with said at least one metal line of said electrically unisolated metal lines.

9. The method for fabricating the IC structure as defined in claim 8, further comprising repeating at least once:
    depositing a dielectric layer;

applying, exposing and developing a layer of photoresist to create at least one via; and depositing at least a second metal line into said at least one via to make underlying contact with at least one metal line of said electrically unisolated metal lines.

10. A method of fabricating an IC structure comprising:

patterning a plurality of electrically unisolated metal lines on a substrate each:

having a height $T_{MET}$ and being parallel one with another; and being separated from the nearest of the other electrically unisolated metal lines;

patterning n electrically isolated metal lines each:

having a width $W_{met}$; and being situated in the separation between each electrically unisolated metal line and the nearest of the other electrically unisolated metal lines;

wherein there is a separation $S_{met}$ between:

each electrically unisolated metal line and the nearest of one of:

another electrically unisolated metal line; or one of said electrically isolated metal lines;

each electrically isolated metal line and the nearest of one of:

another electrically isolated metal line; or one of said electrically unisolated metal lines;

depositing a dielectric layer having a thickness of $T_{idl}$ over the electrically isolated and unisolated metal lines, wherein:

$S_{met}$ is not greater than $(1.4(n+1)T_{idl})+(n)W_{met})$ or twice $T_{idl}$;

n is a maximized whole number not greater than $(S_{met}-1.4T_{idl})/(1.4T_{idl}+W_{met})$;

when n is equal to zero, then one electrically unisolated metal line of said plurality of electrically unisolated metal lines has a first width and the nearest of said plurality of electrically unisolated metal lines has a second width;

said first width is different from said second width;

one of said plurality of electrically isolated or unisolated metal lines is diagonally spaced from the nearest portion of another one of said plurality of electrically isolated or unisolated metal lines by a distance that is equal to $\sqrt{2}*S_{met}$; and said thickness of $T_{idl}$ has a value of at least ($\sqrt{2}*S_{met}$)÷2.

11. The method for fabricating the IC structure as defined in claim 10, wherein the maximum spacing between nearest diagonally spaced points on said electrically isolated or electrically unisolated metal lines is less than or equal to about twice the thickness of the dielectric layer.

12. The method for fabricating the IC structure as defined in claim 10, wherein the minimum width of said electrically isolated or electrically unisolated metal lines and the minimum spacing between the closest parallel electrically isolated or electrically unisolated metal lines are about equal.

13. The method for fabricating the IC structure as defined in claim 10, wherein said dielectric layer is planarized upon said depositing.

14. The method for fabricating the IC structure as defined in claim 10, wherein at least one electrically isolated metal line is situated between two nearest electrically unisolated metal lines.

15. The method for fabricating the IC structure as defined in claim 10, wherein each of the electrically unisolated metal lines of said plurality of electrically unisolated metal lines has a length and a width, and wherein the width of the electrically unisolated metal lines varies.

16. The method for fabricating the IC structure as defined in claim 10, further comprising a guard ring circumscribing said electrically isolated or electrically unisolated metal lines, said guard ring having said separation $S_{met}$ to the nearest electrically isolated or electrically unisolated metal line parallel thereto.

17. The method of fabricating the IC structure as defined in claim 10, further comprising:

applying a layer of photoresist over said dielectric layer;

exposing said layer of photoresist in an area positioned over at least one metal line of said electrically unisolated metal lines;

developing said layer of photoresist to open at least one via positioned over said at least one metal line of said electrically unisolated metal lines; and depositing a second metal line into said at least one via so as to make underlying contact with said at least one metal line of said electrically unisolated metal lines.

18. The method for fabricating the IC structure as defined in claim 17, further comprising repeating at least once:

depositing a dielectric layer;

applying, exposing and developing a layer of photoresist to create at least one via; and depositing at least a second metal line into said at least one via to make underlying contact with at least one metal line of said electrically unisolated metal lines.

19. A method of fabricating an IC structure comprising:

providing a substrate;

patterning on the substrate metal lines that are electrically unisolated and metal features that are electrically isolated; and forming a planar dielectric layer having a thickness of $T_{idl}$ over said metal lines and said metal features, wherein:

the height of the metal lines and metal features are the same;

there is a space between respective adjacent metal lines, and within at least one of said spaces there are n of said metal features each having a width substantially equal to $W_{met}$ and being separated from adjacent metal features and from any adjacent metal lines by a separation distance that is less than or equal to $2*T_{idl}$ where $T_{idl}$ is a constant and n is a positive integer that satisfies the expression:

$n*W_{met} \leq W_{sp} \leq ((n+1)*1.4*T_{idl})+n*W_{met})$, wherein $W_{sp}$ is the width of said at least one of said spaces that has therein said n metal features.

20. The method for fabricating the IC structure as defined in claim 19, wherein:

when n is equal to zero, then one metal line of said metal lines has a first width and the nearest of said metal lines has a second width; and said first width is different from said second width.

* * * * *

UNITED STATES PATENT AND TRADEMARK OFFICE
CERTIFICATE OF CORRECTION

PATENT NO. : 5,981,384
DATED : Nov. 9, 1999
INVENTOR(S) : Werner Juengling

It is certified that error appears in the above-identified patent and that said Letters Patent is hereby corrected as shown below:

Cover Page, References Cited, line 9, change "Aitka" to --Aitken--

Cover Page, Abstract, line 14, change "internetal" to --intermetal--

Col. 1, line 22, after "dielectric" delete "is"

Col. 3, line 36, after "filling" change "problem" to --problems--

Col. 3, line 39, after "metal" change "filing" to --filling--

Col. 4, line 42, after "nearest" change "parallermetal" to --parallel metal--

Col. 6, line 53, change "IDI" to --IDL--

Signed and Sealed this

Thirteenth Day of February, 2001

Attest:

NICHOLAS P. GODICI

*Attesting Officer*   Acting Director of the United States Patent and Trademark Office